(12) United States Patent
Curello et al.

(10) Patent No.: US 7,482,670 B2
(45) Date of Patent: Jan. 27, 2009

(54) ENHANCING STRAINED DEVICE PERFORMANCE BY USE OF MULTI NARROW SECTION LAYOUT

(75) Inventors: Giuseppe Curello, Portland, OR (US); Thomas Hoffmann, Portland, OR (US); Mark Armstrong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 11/440,613

(22) Filed: May 24, 2006

(65) Prior Publication Data
US 2006/0208337 A1    Sep. 21, 2006

Related U.S. Application Data

(62) Division of application No. 10/815,911, filed on Mar. 31, 2004, now Pat. No. 7,101,765.

(51) Int. Cl.
*H01L 29/00* (2006.01)
(52) U.S. Cl. .................... 257/506; 257/213; 257/202; 257/204; 257/206; 257/E27.06; 257/E27.014
(58) Field of Classification Search ............... 257/349, 257/900, 213; 438/424, 626
See application file for complete search history.

(56) References Cited

U.S. PATENT DOCUMENTS

| | | | |
|---|---|---|---|
| 5,635,744 A * | 6/1997 | Hidaka et al. ............... | 257/349 |
| 6,368,931 B1 | 4/2002 | Kuhn et al. | |
| 6,492,216 B1 | 12/2002 | Yeo et al. | |
| 6,563,152 B2 | 5/2003 | Roberds et al. | |
| 6,573,172 B1 | 6/2003 | En et al. | |
| 6,607,948 B1 | 8/2003 | Sugiyama et al. | |
| 6,627,506 B2 | 9/2003 | Kuhn et al. | |
| 6,657,223 B1 | 12/2003 | Wang et al. | |

(Continued)

FOREIGN PATENT DOCUMENTS

WO    WO 03/050871    9/2002

(Continued)

OTHER PUBLICATIONS

Ito. S., et al. "Mechanical Stress Effect of Etch-Stop Nitride and its Impact on Deep Submicron Transistor Design." Electron Devices Meeting, 2000 IEDM Technical Digest. International Dec. 10-13, 2000, Pisctaway, JY, USA, IEEE Dec. 10, 2002, pp. 247-251.

(Continued)

*Primary Examiner*—Leonardo Andújar
*Assistant Examiner*—Tucker Wright
(74) *Attorney, Agent, or Firm*—Blakely, Sokoloff, Taylor & Zafman LLP

(57) ABSTRACT

A semiconductor device having high tensile stress. The semiconductor device comprises a substrate having a source region and a drain region. Each of the source region and the drain region includes a plurality of separated source sections and drain sections, respectively. A shallow trench isolation (STI) region is formed between two separated source sections of the source region and between two separated drain sections of the drain region. A gate stack is formed on the substrate. A tensile inducing layer is formed over the substrate. The tensile inducing layer covers the STI regions, the source region, the drain region, and the gate stack. The tensile inducing layer is an insulation capable of causing tensile stress in the substrate.

11 Claims, 5 Drawing Sheets

U.S. PATENT DOCUMENTS

2003/0127697 A1* 7/2003 Ohta et al. .................. 257/390
2004/0212035 A1 10/2004 Yeo et al.
2005/0032275 A1 2/2005 Toda et al.
2005/0194699 A1* 9/2005 Belyansky et al. .......... 257/900

OTHER PUBLICATIONS

Shimizu A, et al: "Local Mechanical-Stress Control (LMC): A New Technique for CMOS-Performance Enhancement", International Electron Devices Meeting2001. IEDM. Technical Digest. Washington D.C., Dec. 2-5, 2001, pp. 433-436.

Ito. S, et al. "Effect of Mechanical Stress Induced by Etch-Stop Nitride: Impact on Deep Submicron Transistor Performance", Microelectronics Reliability Elsevier U.K, vol. 42, No. 2, Feb. 2002, pp. 201-209.

PCT International Search Report for PCT Application No. PCT/US2005/010159. Mailed Jun. 30,. 2005, (7 pages).

Rim, Kern, et al. "Fabrication and Analysis of Deep Submicron Strained-Si N-MOSFEt's" IEEE Transaction on Electron Devices, vol. 47, No. 7, Jul. 2000, pp. 1406-1415.

* cited by examiner $Z = Z_1 + Z_2 + Z_3$ $Z = Z_1 + Z_2 + Z_3$ $$Z = Z_1 + Z_2 + Z_3$$

FIGURE 7
cross = multi-section layout    square = non-multi section layout
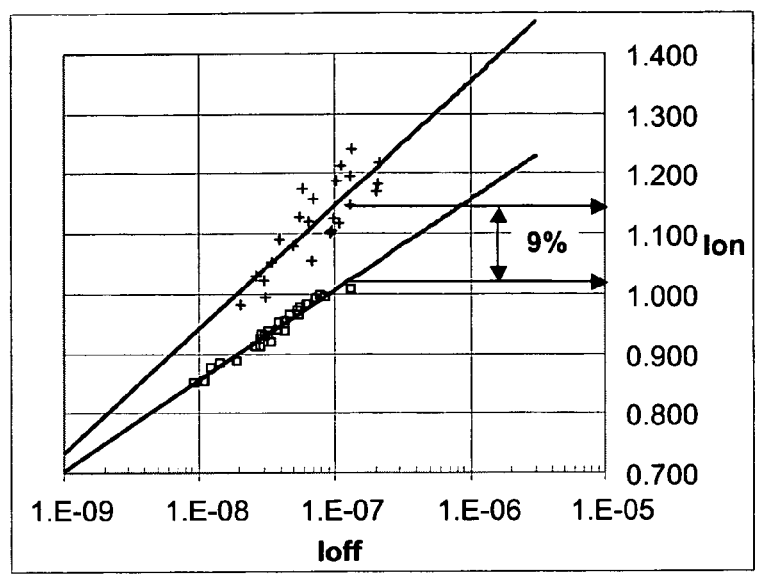
FIGURE 8    cross = multi-section layout    square = non-multi section layout
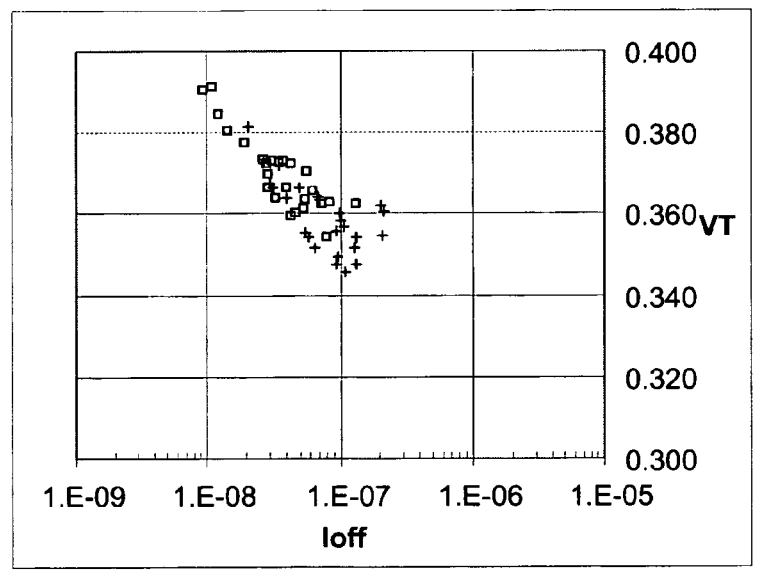

ENHANCING STRAINED DEVICE PERFORMANCE BY USE OF MULTI NARROW SECTION LAYOUT

RELATED APPLICATION

This is a divisional application of U.S. patent application Ser. No. 10/815,911, filed on Mar. 31, 2004, now U.S. Pat. No. 7,101,765 B2.

BACKGROUND

The embodiments of the invention relate to techniques for mechanically stressing the channel of a metal oxide semiconductor (MOS) transistor structure, and more particularly, to an N-Channel MOS transistor, to yield enhanced drive current.

A MOS transistor is the basic building block of digital, integrated circuit components such as processors and memory. The MOS transistor is often described as a three terminal device, with metal lines being provided to its source and drain semiconductor regions and its gate electrode. These lines are part of patterned, metal layers of an integrated circuit die and are insulated from each other via interlayer dielectrics. When used as a switch, the MOS transistor is "turned on" when its drive current in a so-called channel region, between its source and drain regions, is enabled via a voltage applied to its gate electrode.

One way to achieve faster switching of a MOS transistor is to design the device so that the mobility and velocity of its charge carriers in the channel region are increased. An appropriate type of stress in the channel region of an n-channel metal oxide semiconductor (NMOS) transistor is known to improve carrier mobility and velocity, which results in increased drive current for the transistor.

Tensile stress (also known as "strain") in a lateral direction may be obtained by forming a nitride etch stop layer below the first layer of inter-layer dielectric (also referred to as ILD0) to create stress in the channel that lies directly below the etch stop layer. See Ito et al., "Mechanical Stress Effect of Etch-Stop Nitride and Its Impact on Deep Submicron Transistor Design", IEDM-2001, pp. 433-436. To achieve increased drive current via increased carrier mobility and velocity, thicker nitride layers may be used to meet higher, specified stress levels. However, thicker nitride layers can present manufacturing difficulties as well as reliability concerns.

Another technique for obtaining tensile stress in a MOS transistor is to build the transistor structure in a silicon substrate that has been grown on top of a relaxed SiGe buffer layer. The buffer layer pulls the silicon layer above it, to induce tensile stress in the silicon layer. This structure, however, may require a relatively complex and expensive manufacturing process.

BRIEF DESCRIPTION OF THE DRAWINGS

The embodiments of the invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" embodiment of the invention in this disclosure are not necessarily to the same embodiment, and they mean at least one. In the drawings:

FIGS. 7-8 illustrate $I_{on}$ and $I_{off}$ current effect caused by the multi-narrow section layout in the MOS transistor with a nitride etch stop layer formed over the MOS transistor.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Exemplary embodiments of the present invention pertain to a way to enhance tensile stress (or strain) in a semiconductor device such as an NMOS transistor by increasing tensile stress contribution in Z direction (device width) and in Y direction (device length). In one embodiment, a nitride etch stop layer (NESL) is used as a tensile inducing layer.

Figure 1:
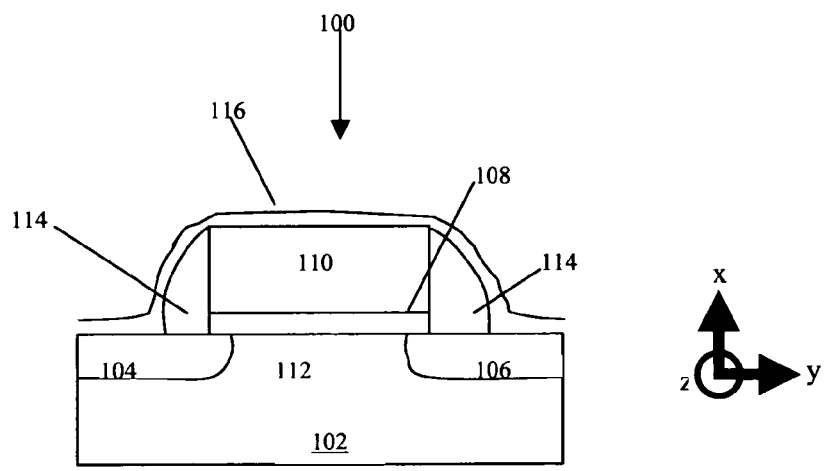
FIG. 1 illustrates an example of a conventional MOS transistor structure.

FIG. 1 illustrates an exemplary semiconductor device 100 (e.g., a MOS transistor). FIG. 1 illustrates haw a tensile stress inducing layer is incorporated into the semiconductor device 100 to create tensile stress in the device 100. The device 100 includes a substrate 102 having a source 104 and a drain 106 regions created therein. The device 100 includes a gate electrode 110 that is separated from a channel region 112 in the substrate 102 by a thin gate dielectric layer 108 such as silicon oxide, oxide-nitride-oxide, or a high-K dielectric. The gate electrode 110 is typically formed of a doped semiconductor material such as polysilicon to minimize resistance of the gate electrode 110. The material of the gate electrode 110 may also be metal. The source 104 and the drain 106 regions are formed on opposing sides of the gate electrode 110. The gate electrode 110 and the gate dielectric layer 108 are typically referred to as a gate stack. Silicide may be formed (not shown) on the gate electrode 110, the source 104 and the drain 106 regions to improve contact by reducing resistance to the gate electrode and the source/drain regions. Silicide may be formed of a metal material such as cobalt or nickel. In one embodiment, the device 100 includes spacers 114 formed on each side of the gate electrode 110. In certain embodiments, such as a polycide fabrication process, spacers 114 are used to protect the gate stack from being shorted to the source and/or drain metal contacts during manufacture. However, an embodiment without the spacers may also work.

In FIG. 1, a tensile stress inducing layer such as a nitride etch stop layer 116 is deposited over the device 100 to introduce tensile stress into the silicon channel 112. The tensile stress enhances electron mobility and in turn increases drive current and circuit performance. The stress introduced can be divided into three components, one along the x direction (perpendicular to the substrate 102), which can be referred to as $D_{xx}$, one along the y direction (current flow direction) the $D_{yy}$ and one along the z direction (device width direction) the $D_{zz}$.

Figure 2:
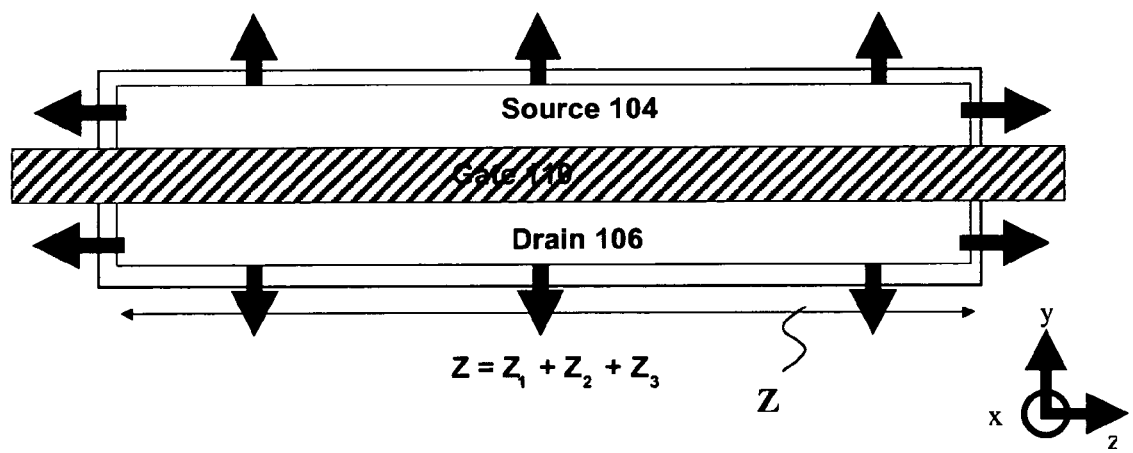
FIG. 2 illustrates a top view of an example of a MOS transistor that points out the direction of the tensile stress caused by a tensile stress inducing layer formed over the MOS transistor.

FIG. 2 illustrates a top view of the device 100 shown in FIG. 1. The nitride etch stop layer 116 is not shown for clarity purpose. The arrows indicate the nitride etch stop pulling direction induced upon the substrate 102.

Of these three components, the $D_{xx}$ is generally small and difficult to modulate, the $D_{zz}$ is normally weak because the only region where the nitride etch stop layer can pull the active silicon in the Z direction is at the very edge of the device so that its effect is not uniform and the pulling action can happen only if a discontinuity exist in the form of a negative shallow trench isolation (STI) step height (STI recess). For this reason currently, little attention is paid to this potential stress component since it cannot be effectively be controlled and exploited. On the other end the $D_{yy}$ which is the main component of the stress is able to enhance transistor performance with respect to an equivalent transistor which makes no use of the tensile capping layer but is limited by the ability of the tensile layer to stretch a relatively large volume of silicon.

Embodiments of the present invention increases the NMOS performance (e.g., drive current increased at fixed $I_{off}$) above the already enhanced strain silicon device by about 3 to 10% depending on device width. Embodiments of the present invention enhanced tensile stress in the device to increase device performance (e.g., increasing current flow or mobility). As will be apparent, embodiments of the present invention can increase the NMOS performance essentially without additional processes. The embodiments of the present invention thus make them a very attractive approach for future technologies or scaling.

Figure 3:
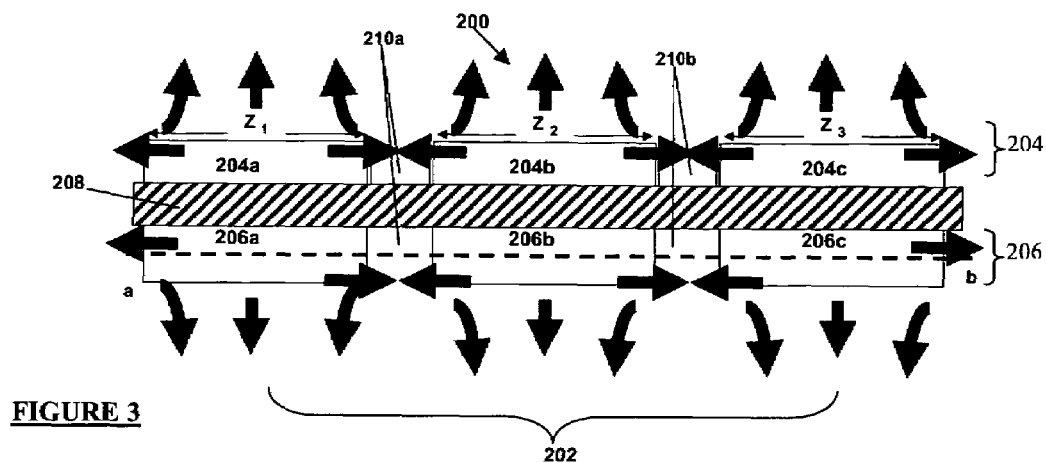
FIG. 3 illustrates a top view of an example of a MOS transistor having multi-narrow sections in a parallel layout and the direction of the tensile stress caused by a tensile stress inducing layer formed over the MOS transistor.

In one embodiment, a semiconductor device 200, e.g., an NMOS transistor, is created to have a multi-narrow sections in a parallel layout. The multi-narrow section layout enhances the tensile stress formed in the device 200 by a tensile stress inducing layer formed on top of the device 200 (FIG. 3). In one embodiment, the tensile stress inducing layer is a nitride etch stop layer. In another embodiment, the tensile stress inducing layer is an insulation film that is capable of inducing a tensile stress to a substrate upon which the tensile stress inducing layer is formed. The tensile stress inducing layer is formed on a silicon substrate in one embodiment. The tensile stress inducing layer can also be formed on various types of substrate including monocrystalline silicon, polycrystalline silicon, silicon-on-insulator, silicon on silicon-germanium, or other suitable semiconductor substrate.

FIG. 3 illustrates the top view of the device 200. The device 200 is configured so that it has a multi-narrow section layout to enhance the tensile stress caused by the tensile stress inducing layer. Enhancing the tensile stress will enhance current mobility and thus, device performance. The device 200 includes a substrate 202 having a source region 204 and a drain region 206. The source region 204 is divided so that the source region 204 includes a plurality of separated sections 204a, 204b, and 204c. The drain region 206 is also divided so that the drain region 206 includes a plurality of separated sections 206a, 206b, and 206c. The device 200 is thus referred to as having a device with a multi-narrow sections layout. To give the device 200 the multi-narrow section layout, a shallow trench isolation (STI) region 210 is formed between each two separated (and adjacent) sections of the source region 204 and the drain region 206. As illustrated in FIG. 3, an STI region 210a is formed between the two source sections 204a and 204b of the source region 204 and the two drain sections 206a and 206b of the drain region 206. Also as illustrated in FIG. 3, an STI region 210b is formed between the two source sections 204b and 204c of the source region 204 and the two drain sections 206b and 206c of the drain region 206. The device 200 also includes a gate stack 208 formed on the substrate 202. The gate stack 208 is formed between the source region 204 and the drain region 206. A tensile stress inducing layer 212 (FIG. 4) is formed over the substrate 202. The tensile stress inducing layer 212 covers the STI regions 210, the source region 204, the drain region 206, and the gate stack 208. As mentioned above, the tensile stress inducing layer 212 is an insulation material capable of causing tensile stress in the substrate. An example of such a tensile stress inducing layer includes a nitride etch stop layer. The tensile inducing layer 212 may have a thickness ranging from about 25 nm to about 150 nm. In one embodiment, the tensile inducing layer 212 impart a stress value between about 200 mega Pascal to about 300 mega Pascal (total stress value) to the substrate 201.

FIG. 3 illustrates the top view of regions on the substrate 202 that get the tensile stress induced by the nitride etch stop layer 212. As can be seen, the nitride etch stop layer 212 can exercise its pulling action on more surface areas sides and sections in the substrate 202 to enhance the tensile stress created in the substrate 202. Having multi-narrow sections (204a-204c and 206a-206c) in the substrate 202 increases the pulling action of the nitride etch stop layer 212 as well as enhancing the $D_{yy}$ and $D_{zz}$ component of the tensile stress to contribute to the total stress and enhance device performance.

Figure 4:
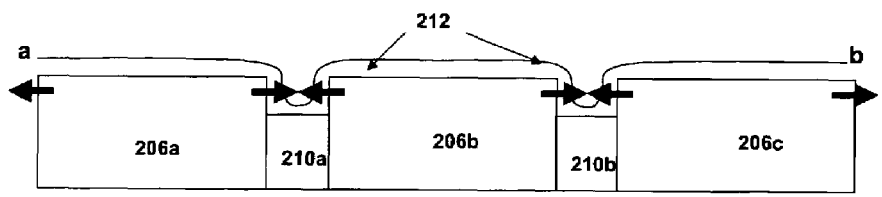
FIG. 4 illustrates a cross-sectional view of the MOS transistor shown in FIG. 3 having a tensile stress inducing layer formed over the drain region of the MOS transistor.

FIG. 4 illustrates a cross-sectional view (along the line a-b of FIG. 3) of the drain region 206 of the device 200. The STI regions 210a-210b are shown to be recessed, or having surfaces that are slightly below the surface of the substrate 202 or the surfaces of the drain sections 206a-206c. Having the STI regions 210a-210b being recessed provide even more sides or open areas in the substrate 202 for the tensile stress inducing layer 212 to import stress pulling in the substrate 202. The STI regions 210a-210b can be recessed because some of the material in the STI regions are etched away during fabrication process, e.g., cleaning the surface of the substrate 202. In one embodiment, the drain sections 206a-206c in total have the same total effective width Z with the device 100 that has no multi-narrow section layout. For example, as show in FIG. 2, the device 100 has a total effective width of Z. Z can be said to be equal to $Z_1+Z_2+Z_3$ where $Z_1$ represents the width of section 206a, $Z_2$ represents the width of section 206b, and $Z_3$ represents the width of section 206c. The device 200 thus, can be configured so that the source and drain sections in sum has a total effective width of Z.

Figure 5:
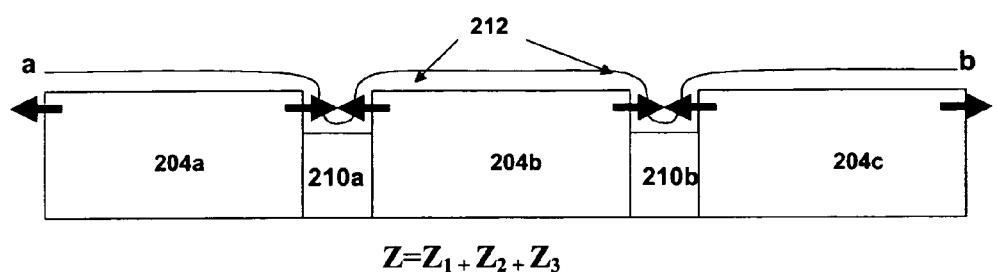
FIG. 5 illustrates a cross-sectional view of the MOS transistor shown in FIG. 3 having a tensile stress inducing layer formed over the source region of the MOS transistor.

FIG. 5 illustrates a cross-sectional view of the source region 204 of the device 200. The source region 204 is configured similarly to the drain region 206 previously described. The source region 204 includes the STI regions 210a-210b between sections 204a, 204b, and 204c as shown in FIG. 5. The STI regions 210a-210b are also shown to be recessed, or having a surface that is slightly below the surface of the substrate 202 or the surfaces of the source sections 204a-204c. The STI regions 210a-210b can be recessed because some of the materials in the STI regions are etched away during fabrication process, e.g., cleaning the surface of the substrate 202. In one embodiment, the drain sections 204a-

204c in total have the same total effective width Z in which section 204a has a width of $Z_1$, section 204b has a width of $Z_2$, and section 204c has a width of $Z_3$.

In one embodiment, the nitride etch step layer 212 is conformal. The nitride etch step layer 21 this conforms to the structure formed on the substrate 202. In one embodiment, a silicide layer (not shown) is formed over the sections 204a-204c of the source region 204 and the sections 206a-206c of the drain region 206. In this embodiment, the nitride etch step layer 212 is formed over the silicide layer.

Figure 6:
FIG. 6 illustrates a cross-sectional view of the MOS transistor shown in FIG. 3 having a tensile stress inducing layer formed over the gate of the MOS transistor.

FIG. 6 illustrates a cross-sectional view of the gate stack 208 of the device 200. The gate stack is continuous and not divided into sections like the source 204 and drain 206 regions. The nitride etch stop layer 212 is formed over the gate stack 208. In one embodiment, a silicide layer (not shown) is formed over the gate stack 208 and in such embodiment, the nitride etch stop layer 212 is formed over the silicide layer.

Dividing the substrate into multiple narrow sections provide more sides in the substrate 202 for the pulling action of the tensile stress inducing layer. And, more stress induced in the substrate leads to higher carrier or current mobility. FIG. 7 illustrates the effect of multi-narrow section layout the in source/drain regions of the substrate for a semiconductor device (e.g., NMOS). This figure compares a conventional transistor having a tensile stress inducing layer (e.g., nitride etch stop layer) formed over the transistor as shown in FIGS. 1-2 to a transistor having a multi-narrow section layout and a tensile stress inducing layer formed over the transistor as shown in FIGS. 3-5. In one embodiment, the tensile stress inducing layer is conformal. In FIG. 7, the x-axis indicates the $I_{off}$ current for the device and the y-axis indicates the $I_{on}$ current for the device. FIG. 7 shows that the drive current at a fixed $I_{off}$ is higher for a device with a multi-narrow section layout. As can be seen, at a particular fixed $I_{off}$, the current flow through the device is about 9% higher for the device with the multi-narrow section layout.

FIG. 8 illustrates that both transistors used in FIG. 7 are switched on at similar or same voltage. In FIG. 8, the x-axis indicates the $I_{off}$ current for the device and the y-axis indicates the threshold voltage (VT) for the device. As shown in this figure, at a particular voltage, (or threshold voltage), the transistor with the multi-narrow section layout has a higher current mobility.

Figure 9:
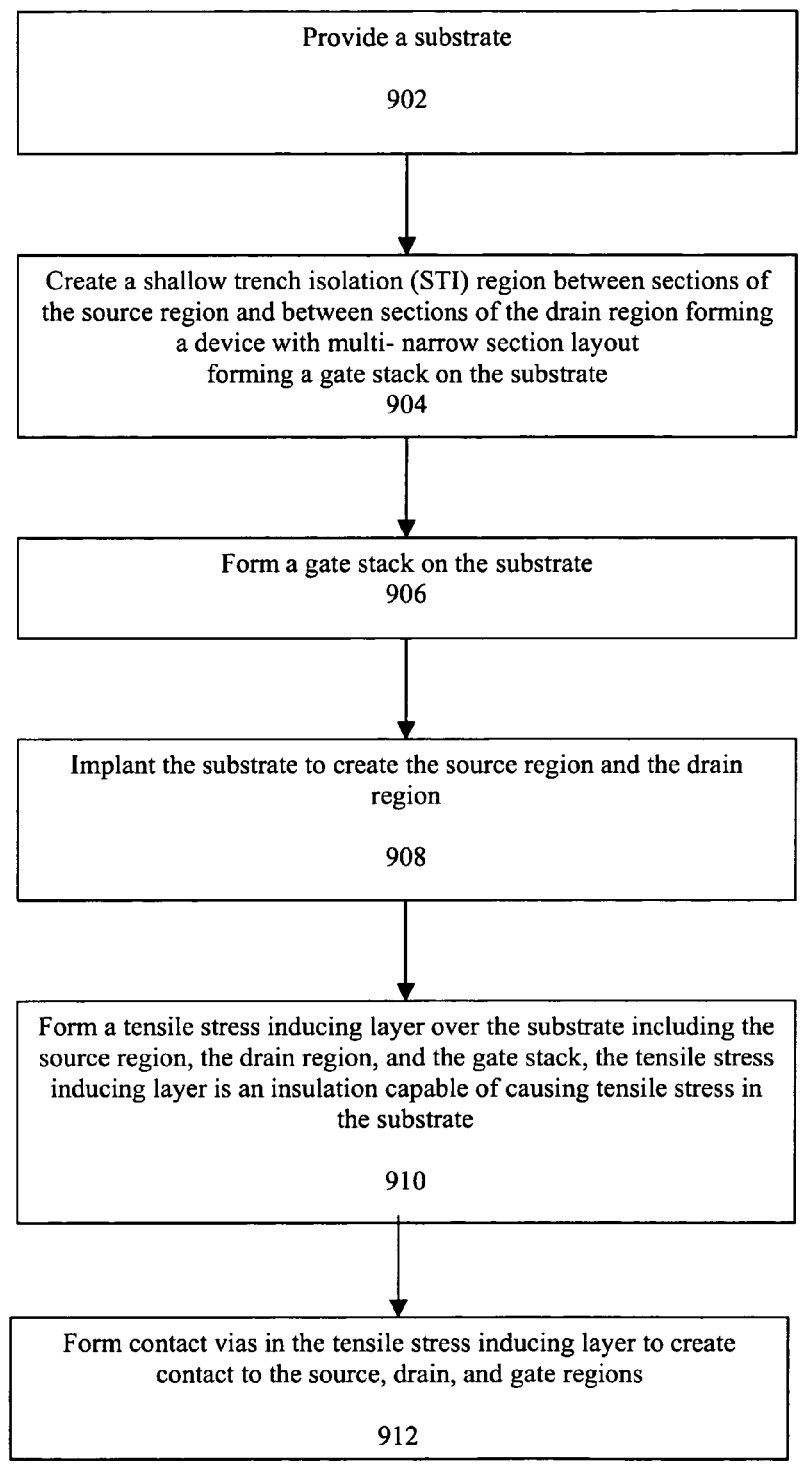
FIG. 9 illustrates exemplary processes of forming an NMOS transistor in accordance with embodiments of the present invention.

FIG. 9 illustrates an exemplary method of making an NMOS transistor that has a multi-narrow section layout and a tensile stress inducing layer (such as a nitride etch stop layer) formed over the transistor. At box 902, a substrate is provided. The substrate may have regions for source and drain. The substrate can be a silicon wafer, a monocrystalline silicon substrate, a polycrystalline silicon substrate, a substrate having silicon formed on a silicon-germanium surface, a silicon-on-insulator substrate, or other suitable semiconductor substrate.

At box 904, a shallow trench isolation (STI) region is created between two sections of the source region and between two sections of the drain region forming a device with multi-narrow section layout. There can be more than two sections for each of the source region and the drain region as shown in FIGS. 3-4. STI regions can also be created in the substrate to isolate one device from another. The STI regions between sections of the source region and between sections of the drain region are formed to enhance and increase areas and sides in the substrate for the tensile stress inducing layer to pull to enhance the tensile stress in the substrate. Methods of creating the STI region are known in the art.

At box 906, a gate stack is formed on the substrate. The gate stack is formed approximately between the source and drain region. To form the gate stack, a dielectric layer is formed on substrate. A gate electrode is then formed on the dielectric layer. Methods of creating the gate stack are known in the art.

At box 908, the substrate is implanted to create the source region and the drain region. In some embodiments, spacers may be formed on each side of the gate stack. At box 910, a tensile stress inducing layer is formed over the substrate including all sections of the source region, all sections of the drain region, and the gate stack. The tensile stress inducing layer thus covers the gate stack, the source region, the drain region, and the spacers. The tensile stress inducing layer is also conformal. The tensile stress inducing layer can be formed using chemical vapor deposition or other suitable technique. The tensile stress inducing layer is made of an insulation material capable of causing tensile stress in the substrate. An example of such a tensile stress inducing layer is a nitride etch stop layer. The tensile stress inducing layer can be other strained insulating film that can pull the semiconductor material on which it has been created (the substrate). Additionally, the tensile stress inducing layer is made of a material that has a different etch rate than the material used to make the STI region to allow for selective etching, for example, when vias are created in the tensile stress inducing layer for contacts to the gate stack, source region, and drain region.

In some embodiments, a silicide layer is formed over the source and drain regions as well as the gate stack to improve contact to the source and drain regions and the gate stack. In such embodiments, the tensile stress inducing layer is formed over the silicide layer and over the substrate as previously mentioned.

In some cases, such as in a complementary MOS process flow, a region of semiconductor material that will become the source and/or drain of a p-channel MOS (PMOS) transistor, in the same integrated circuit die or in the same semiconductor wafer for the NMOS structure, may be covered by a suitable layer prior to forming the tensile stress inducing layer. This layer is designed to help avoid inducing tensile stress in the channel of PMOS transistor structures via the tensile stress inducing layer, because tensile stress might not promote higher carrier mobility and velocity in such transistor structures.

At box 912, contact vias are created in the tensile stress inducing layer to allow to contacts to be made to the source, drain, and gate regions. Conductive traces (e.g., metalization) can be formed on top of the tensile stress inducing layer and into the vias to reach the source, drain, and gate regions.

Embodiments of the present invention can be used in conjunction with other methods of creating tensile stress or strain in a semiconductor substrate. For instance, a method of enhancing carrier mobility by creating a tensile strain or stress in silicon material includes forming a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. In conjunction with the silicon grown on a silicon germanium substrate, the substrate can be divided into many sections and an STI region can be created between each two sections. A tensile stress inducing layer is then formed over the substrate as previously described. The thickness of the tensile stress inducing layer can be controlled so that a particular tensile stress value can be obtained. Embodiments of the present invention thus can be used as a method of creating strain in a semiconductor substrate, alone or in combination with existing methods.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed is:

1. A semiconductor device comprising:
    a substrate having a source region and a drain region, each of the source region and the drain region includes a plurality of completely separated sections, wherein the plurality of completely separated sections in both the source region and drain region are of the same conductivity type, wherein the plurality of completely separated sections in the source region are interconnected together, and wherein the plurality of completely separated sections in the drain region are interconnected together;
    a shallow trench isolation (STI) region formed between each two completely separated sections of the source region and between each two completely separated sections of the drain region;
    a gate stack formed on the substrate; and
    a tensile stress inducing layer formed over the substrate, the tensile stress inducing layer covering the STI regions, the source region, and the drain region.

2. The semiconductor device of claim 1 further comprising:
    a silicide layer formed over the source region, the drain region, and the gate stack and wherein the tensile stress inducing layer formed over the substrate is formed over the silicide layer.

3. The semiconductor device of claim 1 wherein the gate stack includes a gate electrode layer and a gate dielectric layer.

4. The semiconductor device of claim 1 further comprising:
    a contact interconnected to the gate stack.

5. The semiconductor device of claim 1 wherein the STI regions have surfaces that are below the surfaces of the substrate.

6. The semiconductor device of claim 1 wherein the tensile stress inducing layer is a nitride etch stop layer.

7. The semiconductor device of claim 1 wherein the tensile stress inducing layer introduces tensile stress into a channel region in the substrate.

8. The semiconductor device of claim 1 wherein the substrate is one of a silicon comprising substrate, a monocrystalline silicon substrate, a germanium silicon substrate, and silicon on insulator substrate.

9. The semiconductor device of claim 1 wherein the tensile stress inducing layer has a thickness between about 25 nm and about 150 nm.

10. The semiconductor device of claim 1 wherein the tensile stress inducing layer introduces a tensile stress ranging between about 200 mega Pascal and about 300 mega Pascal into the substrate.

11. The semiconductor device of claim 1 wherein the tensile stress inducing layer is a conformal layer.

* * * * *